United States Patent [19]

Nuttall et al.

[11] 3,881,242

[45] May 6, 1975

[54] METHODS OF MANUFACTURING SEMICONDUCTOR DEVICES

[75] Inventors: Roy Nuttall, Cheadle; Leslie Dormer, Poynton, both of England

[73] Assignee: Ferranti Limited, Hollinwood, Lancashire, England

[22] Filed: Nov. 8, 1973

[21] Appl. No.: 413,894

[30] Foreign Application Priority Data

Nov. 8, 1972 United Kingdom .................... 51566

[52] U.S. Cl. ............... 29/589; 148/175; 117/107.2; 117/212; 1117/217; 117/118; 357/59

[51] Int. Cl. ............................................ B01j 17/00

[58] Field of Search .............. 317/235 AT; 148/175; 117/212, 217, 107.2; 29/589, 590, 591; 357/59

[56] References Cited

UNITED STATES PATENTS

| | | | |
|---|---|---|---|
| 3,375,418 | 3/1968 | Garnache | 357/59 |
| 3,460,007 | 8/1969 | Scott | 357/59 |
| 3,484,311 | 12/1969 | Benzing | 357/59 |
| 3,667,008 | 5/1972 | Katnack | 357/59 |
| 3,764,413 | 10/1973 | Kakizaki | 357/59 |
| 3,785,862 | 1/1974 | Grill | 117/107.2 |

*Primary Examiner*—Roy Lake
*Assistant Examiner*—W. C. Tupman
*Attorney, Agent, or Firm*—Cameron, Kerkam, Sutton, Stowell & Stowell

[57] ABSTRACT

A method of providing an ohmic contact for a silicon semiconductor device, the ohmic contact including a layer of tungsten or molybdenum on a polycrystalline silicon layer, includes depositing these two layers consecutively in the same deposition apparatus, the polycrystalline layer being deposited from a silane atmosphere at 700 to 750°C and the metal layer being deposited when a vapour of a compound of the metal, such as the hexafluoride, is supplied to modify the deposition atmosphere, the compound being reduced by the silane.

16 Claims, 7 Drawing Figures

METHODS OF MANUFACTURING SEMICONDUCTOR DEVICES

Figure 1A:
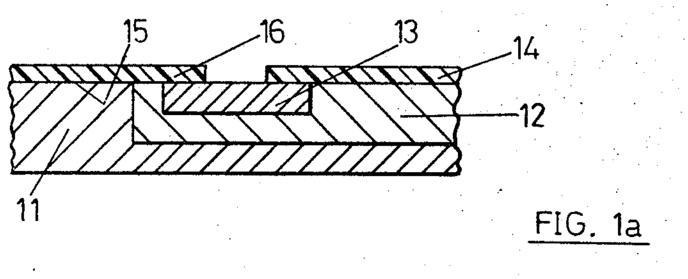

This invention relates to methods of manufacturing semiconductor devices, and in particular devices each having a monocrystalline silicon semiconductor body, a silicon oxide passivating layer on the monocrystalline semiconductor body, and at least one ohmic contact extending both through an aperture in the passivating layer to the semiconductor body and on portions of the silicon oxide layer adjacent to the aperture, the contact including a tungsten or a molybdenum layer.

A layer of each of these metals adheres well to silicon. However, such a layer deposited from the vapour of a compound of the metal does not form a satisfactory bond with an underlying silicon oxide layer. Vapour deposition of tungsten or molybdenum is desirable because the metal is deposited in a denser form than when deposited by means of evaporation or sputtering. In addition, in the former process, the metal layer is less affected by the relief profile of the surface upon which the deposition occurs that when deposited by the other methods. Also the metal is deposited from an oxygen-free atmosphere so that the deposited metal is not contaminated by oxygen.

A layer of aluminium adheres well to a silicon oxide passivating layer, but there is not a satisfactory aluminium compound from the vapour of which an aluminium layer may be deposited. Further, a layer of aluminium deposited by means of evaporation or sputtering is not as advantageous as a tungsten or molybdenum layer deposited from a vapour of a metal compound. This is because aluminium does not operate so well as the other metal contact layers at high temperatures, and it is not possible subsequently to provide a passivating layer on the layer at as high a temperature as is desirable. In addition the aluminium may react with the silicon so that it penetrates under the silicon oxide adjacent to the aperture in the passivating layer, with the possibility of a P-N junction provided in the semiconductor body beneath the passivating layer being shorted.

Tungsten or molybdenum when deposited from the vapour of a metal compound is suitable for inclusion in an ohmic contact for a silicon semiconductor device. Each has a co-efficient of thermal expansion similar to that of silicon, each has a high coefficient of electrical conductivity, and each may be etched easily by photolithographic techniques.

It is an object of the present invention to provide a novel and advantageous method of forming an ohmic contact including a layer of tungsten or molybdenum in a semiconductor device having a monocrystalline silicon semiconductor body and a passivating layer of silicon oxide, the contact extending both through an aperture in the silicon oxide a layer and on portions of the silicon oxide layer adjacent to the aperture.

According to the present invention a method of manufacturing a semiconductor device, the semiconductor device having a monocrystalline silicon semiconductor body, a passivating layer of silicon oxide on at least one surface of the semiconductor body defining an aperture through which a part of said surface of the semiconductor body is exposed, and an ohmic contact extending both to the part of said surface of the semiconductor body exposed through the aperture in the passivating layer and on portions of the passivating layer adjacent to the aperture, the method includes forming the ohmic contact by depositing a layer of polycrystalline silicon and a layer of a metal selected from the group tungsten and molybdenum, the polycrystalline layer and the metal layer are deposited consecutively within the same deposition apparatus, the polycrystalline layer is deposited from an atmosphere of silane maintained at a temperature in the range 700° to 750°C within the deposition apparatus, when the metal layer is to be deposited the atmosphere is modified by the introduction therein of a vapour of a compound of the metal, the modified atmosphere being maintained at a temperature in the same range, and the metal layer being deposited from the modified atmosphere by the reduction of the compound by the silane.

Thus, the deposition of the polycrystalline layer and the metal layer is easily obtained by consecutive process steps in the same deposition apparatus.

The compound of the metal introduced into the deposition apparatus may be the hexafluoride of the metal. The atmospheres within the deposition apparatus may include an inert diluent.

The layer of polycrystalline silicon forms a secure bond to both the silicon oxide layer and the metal layer, and ensures that the metal layer is satisfactorily secured to the passivating layer. The polycrystalline layer may be no thicker than is required to ensure that it is satisfactorily bonded to both the silicon oxide layer and the metal layer, for example, having a thickness in the range 200A to 500A. The presence of a portion of the polycrystalline layer between the metal layer and the monocrystalline silicon body does not affect adversely the strength of the bond therebetween.

The deposited polycrystalline layer may provide within the ohmic contact a resistance required for the satisfactory operation of the semiconductor device.

The metal layer tends to have a surface oxide layer when exposed to air or oxygen. The presence of such a surface oxide layer may prevent a satisfactory electricial connection being made to the metal layer. Hence a second polycrystalline layer may be deposited on the metal layer before the removal of the device from the deposition apparatus, the supply of the compound of the metal to the deposition apparatus being stopped during the deposition of the second polycrystalline layer. The ohmic contact may be completed by depositing gold or aluminium onto the second polycrystalline layer to facilitate making an electrical connection to the ohmic contact. The second polycrystalline layer may have the minimum required thickness so that a satisfactory electrical connection may be made to the ohmic contact, for example, gold may penetrate into the second polycrystalline layer forming an intermetallic compound therewith.

Figure 1B:
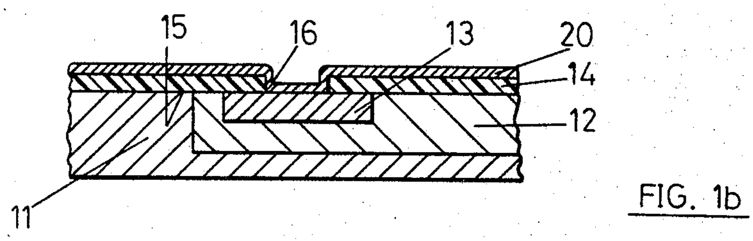
Figure 1C:
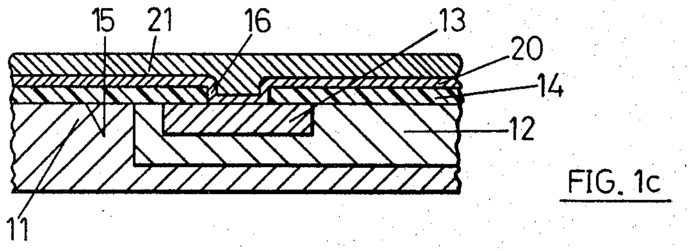
Figure 1D:
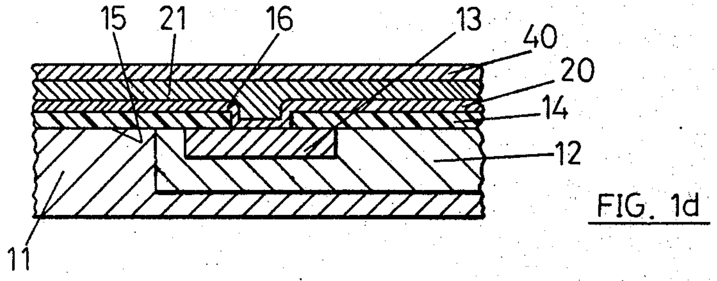
Figure 1E:
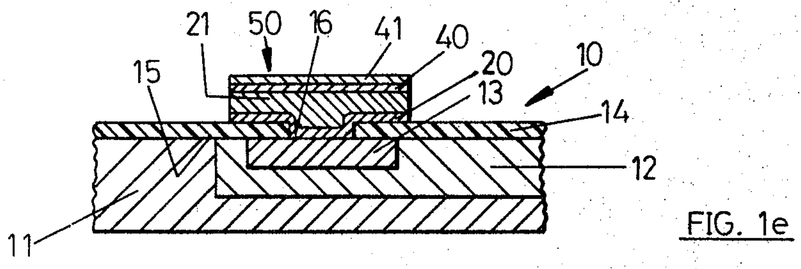
Figure 2:
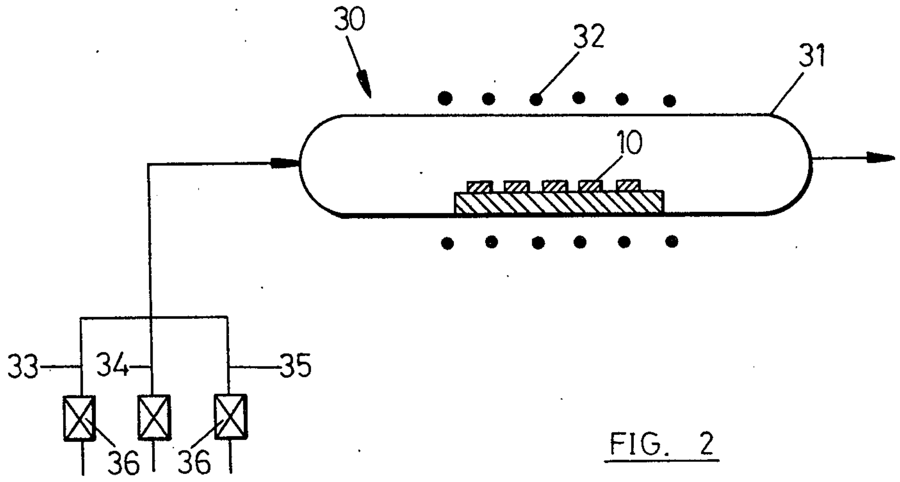
Figure 3:
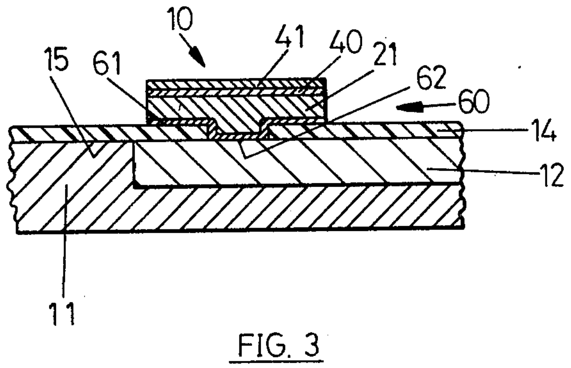

The present invention will now be described by way of example with reference to the accompanying drawings, in which:

FIGS. 1*a* to 1*e* each comprise a section of part of a transistor semiconductor device at different successive stages in the provision of an ohmic contact to the emitter, FIG. 1*e* illustrating the completed ohmic contact, FIG. 2 is a partly-diagrammatic section of deposition apparatus employed in providing the ohmic contact, and FIG. 3 corresponds to FIG. 1*e* but shows part of a transistor having a modified construction.

The transistor 10 illustrated partially in FIG. 1*e* comprises a monocrystalline silicon semiconductor body 11, FIG. 1*a* and 1*e* illustrating successive stages in the provision of an ohmic contact for the emitter. Initially the monocrystalline body in wholly of N conductivity type, but a P type base 12 and an N type emitter 13 are formed by known diffusion steps, and as shown in FIG. 1*a*, during the diffusion steps, or subsequently thereto, a passivating silicon oxide layer 14 is provided on a surface 15 of the monocrystalline body and over the base 12 and the emitter 13. An aperture 16 is provided in the passivating layer 14, by known photolithographic techniques, to expose a region of the emitter 13.

The ohmic contact to the emitter 13 is required both to extend through the aperture 16 in the passivating layer 14 and to extend on and to be secured to the adjacent portions of the passivating layer. According to the present invention the ohmic contact is formed by including a tungsten layer, the tungsten layer being deposited from a vapour of tungsten hexafluoride in conventional deposition apparatus. The deposited layer has a dense form, and whilst alone it would adhere well to the exposed region of the monocrystalline silicon body 11, it would not be securely bonded to the passivating layer 14. Consequently, as shown in FIG. 1*b*, the ohmic contact also includes a layer 20 of polycrystalline silicon deposited within the deposition apparatus before the deposition of the metal layer. The polycrystalline layer 20 is sufficiently thick to be bonded to the passivating layer 14 and to enable the metal layer, when deposited, to be bonded to the polycrystalline layer 20, the polycrystalline layer 20 having a thickness to the range 200A to 500A. The polycrystalline layer 20 is of N conductivity type, an appropriate conductivity-type-determining impurity being included in the atmosphere within the deposition apparatus from which the polycrystalline layer is deposited. Thus, no significant amount of impurity is transferred between the emitter 13 and the polycrystalline layer 20; and the polycrystalline layer 20 does not introduce any significant resistance into the ohmic contact.

As shown in FIG. 1*c*, the metal layer 21 is then deposited on the polycrystalline layer 20. The presence of a portion of the polycrystalline layer between the emitter 13 and the metal layer 21, and forming an ohmic contact to the emitter, does not reduce the strength of the bond of the metal layer to the monocrystalline silicon body 11.

The polycrystalline silicon layer 20 and the metal layer 21 are deposited consecutively in the deposition apparatus 30 shown in FIG. 2. The apparatus 30 comprises a chamber 31, in which the deposition atmospheres are provided, and heating means indicated generally at 32. Three passages are provided into the chamber 31, a passage 33 connected to a source (not shown) of silane doped with impurity, the silane being mixed with phosphine gas if the impurity is phosphorus, a passage 34 connected to a source of nitrogen (not shown), and a passage 35 connected to a source of tungsten hexafluoride (not shown). Each passage, 33, 34 and 35 is provided with a valve 36 controlling the flow of the vapour or the gas from the associated supply to the chamber 31.

Initially the deposition atmosphere maintained in the chamber 31 is silane, the gaseous dopant, and the inert diluent nitrogen. From this atmosphere the doped polycrystalline silicon layer 20 is deposited. Subsequently, tungsten hexafluoride is introduced into the chamber 31 to modify the deposition atmosphere therein, and the tungsten layer 21 is deposited instead of the silicon. The silane present in the modified atmosphere reduces the tungsten hexafluoride.

Because the tungsten layer 21 oxidises in the presence of air or oxygen, as shown in FIG. 1*d*, the metal layer 21 is coated with a second polycrystalline silicon layer 40 before the device 10 is removed from the deposition apparatus 30 to prevent this oxidation. The second polycrystalline layer 40 is provided merely by stopping the supply of tungsten hexafluoride to the chamber 31.

The temperature of the atmospheres within the chamber 31 is maintained throughout these deposition steps in the range 700° to 750°C.

As shown in FIG. 1*e*, the ohmic contact 50 is completed by depositing gold by evaporation onto the second polycrystalline layer 40 to form an inter-metallic compound 41 therewith. An electrical connection easily may be made to the inter-metallic compound 41 and, hence, to the ohmic contact 50. The second polycrystalline layer 40 is sufficiently thick to be bonded to the metal layer 21 and to form the inter-metallic compound 41. The second polycrystalline layer 40 also is doped and does not introduce any significant resistance into the ohmic contact.

Because the ohmic contact 50 is formed within the deposition apparatus 30 in an oxygen-free atmosphere the metal layer 21 in not contaminated by oxygen when deposited.

At least the different layers 20, 21 and 40 of the ohmic contact 50 are deposited in an initially-continuous form and are etched by known photolithographic techniques in providing the contact 50.

The metal layer 21 has a dense form and its current-carrying properties are better than an aluminium layer deposited by evaporation or sputtering, the dense form being obtainable when the metal layer is deposited from a vapour of a metal compound. Another advantage of this method of depositing the metal is that the deposited layer is less significantly affected by the profile of the surface upon which it is deposited than when deposited by evaporation or sputtering.

The method of providing an ohmic contact according to the present invention, and as described above, may be modified in various ways.

The presence of at least one polycrystalline layer within the ohmic contact may be such that a desired finite resistance is introduced into the ohmic contact, such a finite resistance possibly being required for the satisfactory performance of the semiconductor device. The thickness of each polycrystalline layer is arranged to be such that the required resistance is obtained with the impurity concentration in the deposited polycrystalline layer.

Conductivity-type-determining impurity may be transferred to the monocrystalline body from the deposited polycrystalline layer.

In another method a P-N junction is produced by the deposition of the polycrystalline layer, this P-N junction possibly being adjacent to the interface between the polycrystalline layer and the monocrystalline body. Such a semiconductor device comprising a transistor is illustrated partially at 60 in FIG. 3. Parts of the device of FIG. 3 identical to or closely resembling parts of the device of FIG. 1*e* are identified by the same reference numbers as the parts of FIG. 1*e*. However, in the transistor 60 of FIG. 3 the N-type emitter 61 is provided within the first polycrystalline layer 20 on the P-type base exposed through the aperture 62 in the passivating layer 14.

The metal layer may be of molybdenum, molybdenum hexafluoride being introduced into the deposition apparatus instead of the tungsten hexafluoride.

The electrical connection to the metal layer may be obtained in various different ways. Aluminium may be deposited on the second polycrystalline layer 40 instead of gold. It may be possible to obviate the need to provide gold or aluminium and/or the second polycrystalline silicon layer.

Argon may comprise the inert diluent within the chamber 31 instead of nitrogen.

The or each polycrystalline layer may not be deposited in a doped form, no conductivity-type-determining impurity being supplied to the deposition apparatus. In such a process conductivity-type-determining impurity may be transferred to the first deposited polycrystalline layer from the contiguous region of the monocrystalline semiconductor body, for example, to ensure that the resistance of the ohmic contact is lower than would otherwise be the case.

What we claim is:

1. A method of manufacturing a semiconductor device, the device having a monocrystalline silicon semiconductor body, a passivating layer of silicon oxide on at least one surface of the semiconductor body defining an aperture through which a part of said surface of the semiconductor body is exposed, and an ohmic contact extending both to the part of said surface of the semiconductor body exposed through the aperture in the passivating layer and on portions of the passivating layer adjacent to the aperture, the method including forming the ohmic contact by depositing a layer of polycrystalline silicon and a layer of metal selected from the group tungsten and molybdenum, the polycrystalline layer and the metal layer are deposited consecutively within the same deposition apparatus, the polycrystalline layer is deposited from an atmosphere of silane maintained at a temperature in the range 700° to 750°C within the deposition apparatus, when the metal layer is to be deposited the atmosphere is modified by the introduction therein of a vapour of a compound of the metal, the modified atmosphere being maintained at a temperature in the same range, and the metal layer being deposited from the modified atmosphere by the reduction of the compound by the silane.

2. A method as claimed in claim 1 in which the compound of the metal introduced into the deposition apparatus is the hexafluoride of the metal.

3. A method as claimed in claim 1 in which the atmospheres within the deposition apparatus include an inert diluent.

4. A method as claimed in claim 1 in which the thickness of the polycrystalline layer deposited is in the range 200A to 500A.

5. A method as claimed in claim 1 in which conductivity-type-determining impurity is transferred to the deposited polycrystalline layer from the contiguous region of the monocrystalline semiconductor body.

6. A method as claimed in claim 1 in which the atmosphere within the deposition apparatus includes a conductivity-type-determining impurity so that the deposited polycrystalline layer is doped.

7. A method as claimed in claim 6 in which conductivity-type-determining impurity is transferred from the polycrystalline layer to the monocrystalline semiconductor body.

8. A method as claimed in claim 6 in which the polycrystalline layer is of one conductivity type and the region of the monocrystalline semiconductor body exposed through the aperture in the silicon oxide passivating layer is of the opposite conductivity type, a P-N junction being produced by the deposition of the polycrystalline layer.

9. A method as claimed in claim 1 in which the deposited polycrystalline layer provides within the ohmic contact a resistance required for the satisfactory operation of the semiconductor device.

10. A method as claimed in claim 1 in which a second polycrystalline layer is deposited on the metal layer before the removal of the device from the deposition apparatus, the supply of the compound of the metal to the deposition apparatus being stopped during the deposition of the second polycrystalline layer.

11. A method as claimed in claim 10 in which both the deposited polycrystalline layers in combination provide within the ohmic contact a resistance required for the satisfactory operation of the semiconductor device.

12. A method as claimed in claim 10 in which the ohmic contact is completed by depositing gold onto the second polycrystalline layer to facilitate making an electrical connection to the ohmic contact.

13. A method as claimed in claim 12 in which the gold is caused to penetrate into the second polycrystalline layer to form an inter-metallic compound therewith.

14. A method as claimed in claim 12 in which the second polycrystalline layer has the minimum required thickness so that a satisfactory electrical connection may be made to the ohmic contact.

15. A method as claimed in claim 10 in which the ohmic contact is completed by depositing aluminium onto the second polycrystalline layer to facilitate making an electrical connection to the ohmic contact.

16. A method as claimed in claim 15 in which the second polycrystalline layer has the minimum required thickness so that a satisfactory electrical connection may be made to the ohmic contact.

* * * * *